(12) United States Patent
Clough et al.

(10) Patent No.: US 10,232,583 B2
(45) Date of Patent: Mar. 19, 2019

(54) SPARSE TRUSS STRUCTURES AND METHODS OF MAKING THE SAME

(71) Applicant: HRL LABORATORIES, LLC, Malibu, CA (US)

(72) Inventors: Eric C. Clough, Santa Monica, CA (US); Jie Ensberg, Sherman Oaks, CA (US); Alan J. Jacobsen, Woodland Hills, CA (US); Jacob M. Hundley, Newbury Park, CA (US); William Carter, Calabasas, CA (US); Tobias A. Schaedler, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 734 days.

(21) Appl. No.: 14/835,385

(22) Filed: Aug. 25, 2015

(65) Prior Publication Data

US 2017/0057193 A1 Mar. 2, 2017

(51) Int. Cl.
| | |
|---|---|
| B32B 3/08 | (2006.01) |
| G03F 7/00 | (2006.01) |
| G02B 6/12 | (2006.01) |
| C25D 5/56 | (2006.01) |
| C25D 7/00 | (2006.01) |
| G03F 7/20 | (2006.01) |
| G02B 6/00 | (2006.01) |

(52) U.S. Cl.
CPC ............... B32B 3/085 (2013.01); C25D 5/56 (2013.01); C25D 7/00 (2013.01); G02B 6/00 (2013.01); G02B 6/12002 (2013.01); G03F 7/0005 (2013.01); G03F 7/0037 (2013.01); G03F 7/201 (2013.01); G03F 7/2012 (2013.01); Y10T 428/12347 (2015.01); Y10T 428/249953 (2015.04); Y10T 428/249991 (2015.04)

(58) Field of Classification Search
CPC . Y10T 428/249991; Y10T 428/249953; Y10T 428/12347
See application file for complete search history.

(56) References Cited

U.S. PATENT DOCUMENTS

| | | | |
|---|---|---|---|
| 7,963,085 B2 | 6/2011 | Sypeck et al. | |
| 8,197,930 B1 | 6/2012 | Jacobsen et al. | |
| 8,315,499 B1 | 11/2012 | Jacobsen et al. | |
| 8,435,438 B1 * | 5/2013 | Gross | B22F 1/0007 264/494 |
| 8,921,702 B1 | 12/2014 | Carter et al. | |

(Continued)

OTHER PUBLICATIONS

Ashby et al., "Metal Foams, A Design Guide," Butterworth-Heinemann, 263 pages. 2000.

(Continued)

*Primary Examiner* — Betelhem Shewareged
(74) *Attorney, Agent, or Firm* — Lewis Roca Rothgerber Christie, LLP (57) ABSTRACT

A sparse micro-truss structure having a series of unit cells arranged in an array is disclosed. Each of the unit cells includes a series of struts interconnected at a node. Adjacent unit cells are spaced apart by a gap. Spacing apart the adjacent unit cells is configured to reduce the sensitivity of the sparse micro-truss structure to premature mechanical failure due to buckling in one or more of the struts compared to related art micro-truss structures having a series of fully interconnected unit cells.

20 Claims, 6 Drawing Sheets

(56) References Cited

U.S. PATENT DOCUMENTS

| 2012/0244475 A1 | 9/2012 | Rock et al. |
| 2013/0143060 A1 | 6/2013 | Jacobsen et al. |
| 2014/0272275 A1 | 9/2014 | Yang et al. |
| 2015/0176132 A1 | 6/2015 | Hundley et al. |

OTHER PUBLICATIONS

Deshpande et al., "Foam Topology Bending Versus Stretching Dominated Architectures," Acta Materialia, 49:1035-1040, 2001.
Deshpande et al., "Collapse of truss core sandwich beams in 3-point bending," International Journal of Solids and Structures, 38:6275-6305, 2001.
Deshpande et al., "Effective properties of the octet-truss lattice material," Journal of the Mechanics and Physics of Solids, 49:1747-1769, 2001.
Gibson et al., "Cellular Solids: Structures and Properties," Cambridge University Press, Chapters 4 and 5, 143 pages, 1988.
International Preliminary Report on Patentability for corresponding Application No. PCT/US2015/046771, dated Dec. 19, 2017 (10 pages).
International Search Report and Written Opinion for International Application No. PCT/US2015/046771, dated May 19, 2016, 12 pages.

* cited by examiner

SPARSE TRUSS STRUCTURES AND METHODS OF MAKING THE SAME

FIELD

The present disclosure relates generally to micro-truss structures and, more particularly, to sparse micro-truss structures.

BACKGROUND

Structural components commonly include a pair of rigid facesheets separated by a lightweight core. The lightweight core may be either a closed-cell material, such as honeycomb or closed-cell foam, or an open-cell configuration, such as a lattice or truss structure. However, structural elements with truss cores may tend to suffer from buckling failure due to the relatively high aspect ratios of individual struts within the truss core.

Additionally, related art truss cores typically include an interconnected network of ordered struts. However, the interconnectedness of related art truss structures makes the structure more susceptible to premature failure due to manufacturing defects in one or more of the struts. For instance, one or more of the struts in a related art truss structure may include a manufacturing defect that causes premature buckling or bending deformation of those defective struts and the premature failure of those defective struts may, in turn, lead to the failure of the overall structure. Accordingly, truss structures with an ordered arrangement of interconnected struts have an increased sensitivity to the premature failure of the one or more defective struts within the truss structure.

Additionally, related art truss structures may increase the strut diameter and/or alter the angle of the struts to compensate for anticipated manufacturing defects in the struts. However, increasing the diameter of the struts increases the overall weight of the structure and altering the strut angles trades off between compression strength and shear strength of the structure.

SUMMARY

The present disclosure is directed to various embodiments of a micro-truss structure. In one embodiment, the micro-truss structure includes a series of unit cells arranged in an array. Each of the unit cells includes a series of struts interconnected at a node. At least two adjacent unit cells are spaced apart by a gap. The array may be rectilinear. The series of unit cells may include a first series of unit cells arranged in a first row of the array and a second series of unit cells arranged in a second row of the array. The array may be a staggered array and the second series of unit cells in the second row of the array may be laterally offset from the first series of unit cells in the first row of the array. At least one of the struts in each of the first series of unit cells in the first row may be interconnected to one of the struts in one of the second series of unit cells in the second row. The second series of unit cells in the second row of the array may be aligned with the first series of unit cells in the first row of the array, and each of the second series of unit cells may be spaced apart by a gap from a corresponding unit cell of the first series of unit cells. The struts may be solid or hollow. The struts in each of the unit cells may be arranged in a square base pyramid configuration or a triangular base pyramid configuration. The micro-truss structure may also include a first facesheet coupled to the node of each of the unit cells and a second facesheet coupled to ends of the struts. The unit cells may be half unit cells or full unit cells. The struts may be made out of any suitable material, such as polymer, metal, metal alloy, ceramic, or any combination thereof. The length of the struts, the diameter of the struts, the spacing between the nodes, and/or the height of the unit cells may vary across the micro-truss structure.

The present disclosure is also directed to various methods of manufacturing a micro-truss structure. In one embodiment, the method includes irradiating a volume of photo-monomer with a series of light beams to form a series of unit cells arranged in an array. Each of the unit cells includes a series of polymer optical waveguides interconnected at a node. At least two adjacent unit cells are spaced apart by a gap. The light beams may be directed through a series of apertures defined in a mask and the apertures in the mask may be arranged in either an aligned array or a staggered array. The method may also include coupling a first facesheet to the node of each of the unit cells and coupling a second facesheet to ends of the polymer optical waveguides. The method may also include coating the polymer optical waveguides with a dissimilar material by any suitable process, such as electrodeposition, electroplating, vapor deposition, spray coating, dip coating, or any combination thereof. The method may also include selectively removing the polymer optical waveguides to form a plurality of interconnected hollow tubular struts formed out of the dissimilar material coated onto the polymer optical waveguides. The method may also include orienting the light beams such that the polymer optical waveguides in each of the unit cells are arranged in a square base pyramid configuration or a triangular base pyramid configuration.

This summary is provided to introduce a selection of concepts that are further described below in the detailed description. This summary is not intended to identify key or essential features of the claimed subject matter, nor is it intended to be used in limiting the scope of the claimed subject matter.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Embodiments of the present disclosure are directed to micro-truss structures having a relatively sparse arrangement of structural elements compared to related art truss structures. In the context of the embodiments of the present disclosure, a micro-truss structure is an ordered three-dimensional structure at the micrometer scale. Embodiments of the micro-truss structures of the present disclosure are configured to exhibit improved mechanical performance compared to related art micro-truss structures having the same relative density. The micro-truss structures of the present disclosure may be incorporated into any suitable structure, such as, for instance, in an automobile (e.g., as a chassis component, an impact beam, floorboards, stiffeners, or enclosures) or an aircraft (e.g., hull components, wings, control surfaces, rotor blades, or floorboards). Additionally, embodiments of the micro-truss structures of the present disclosure may be used as a fluid conduit due to the open-cell arrangement of micro-truss structures.

Figure 1A:
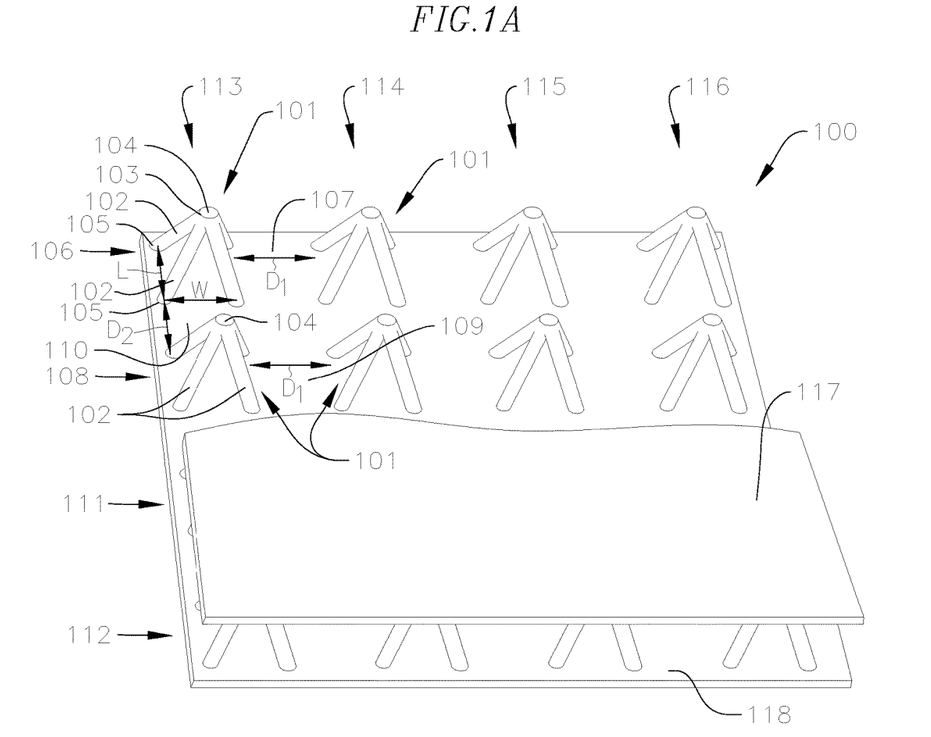
FIGS. 1A and 1B are a perspective view and a side view, respectively, of a sparse micro-truss structure according to one embodiment of the present disclosure.
Figure 1B:
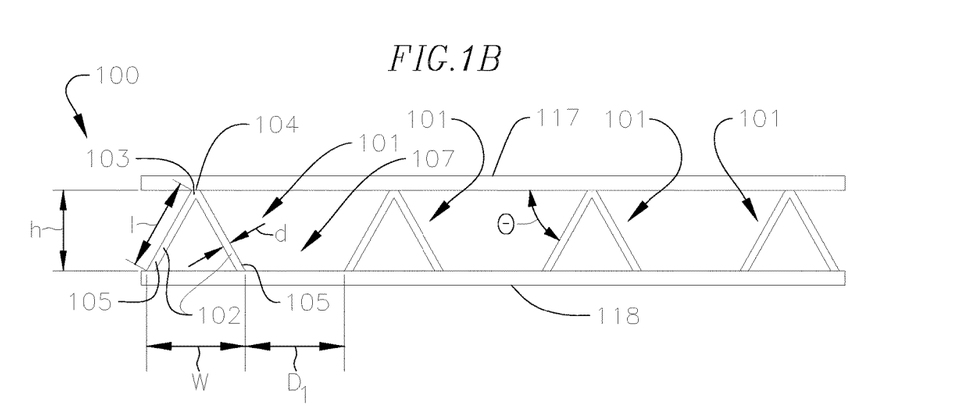

With reference now to FIGS. 1A and 1B, a sparse micro-truss structure 100 according to one embodiment of the present disclosure includes a plurality of unit cells 101 arranged in an ordered array having a plurality of rows and a plurality of columns. In the illustrated embodiment, the array is rectilinear, although in one or more alternate embodiments, the array may have any other suitable configuration, such as, for instance, a circular array. Accordingly, the rows and columns of the array may be either linear or non-linear. Additionally, in the illustrated embodiment, each of the unit cells 101 includes a plurality of interconnected struts 102 (e.g., a unit cell 101 is defined by a grouping of interconnected struts 102). In each unit cell 101, upper ends 103 of the struts 102 intersect and are interconnected at a node 104. In the illustrated embodiment, each of the struts 102 has a length l measured from a lower end 105 of the strut 102 to the upper end 103 of the strut 102 at the node 104. Although in the illustrated embodiment the length l of the struts 102 is constant across the sparse micro-truss structure 100, in one or more alternate embodiments, the length l of the struts 102 may vary across the sparse micro-truss structure 100 (e.g., the length l of the struts 102 may vary between the unit cells 101). Additionally, in the illustrated embodiment, each unit cell has a height h. Although in the illustrated embodiment the height h of the unit cells 101 is constant across the sparse micro-truss structure 100, in one or more alternate embodiments, the height h of the unit cells 101 may vary across the sparse micro-truss structure 100 (e.g., the height h of the unit cells 101 may vary between the unit cells 101). In the illustrated embodiment, the struts 102 have a circular cross-section having an outer diameter d. In one or more alternate embodiments, the struts 102 may have any other cross-sectional shape suitable for the intended application of the sparse micro-truss structure 100, such as, for instance, triangular, pentagonal, hexagonal, polygonal, oval, or star-shaped. Although in the illustrated embodiment each strut 102 has the same diameter d, in one or more embodiments, the diameter d of the struts 102 may vary across the sparse micro-truss structure 100 (e.g., the diameter d of the struts 102 may vary between the unit cells 101). Additionally, in one or more embodiments, the diameter d of the struts 102 may vary (e.g., taper) along the length of the strut 102. The height h of the unit cells 101 and the length l and diameter d of the struts 102 may be selected based on the desired performance characteristics of the sparse micro-truss structure 100.

With continued reference to the embodiment illustrated in FIGS. 1A and 1B, each of the unit cells 101 in a first row 106 of the sparse micro-truss structure 100 is spaced apart from an adjacent one of the unit cells 101 in the first row 106 by a gap 107 having a distance $D_1$. The distance $D_1$ is measured between the lower ends 105 of the struts 102 of the adjacent unit cells 101 in the first row 106. Accordingly, the struts 102 of each of the unit cells 101 are disconnected from the struts 102 of the adjacent unit cells 101 in the first row 106. In the illustrated embodiment, the distance $D_1$ that adjacent unit cells 101 are spaced apart is equal or substantially equal to a width W of the unit cells 101 defined between the lower ends 105 of the struts 102, although in one or more alternate embodiments, the unit cells 101 in the in the first row 106 may be spaced apart by any other suitable distance depending on the desired performance characteristics of the sparse micro-truss structure 100 (e.g., the adjacent unit cells 101 in the first row 106 may be spaced apart by a distance greater or less than the width W of the unit cells 101 in the first row 106). Additionally, although in the illustrated embodiment the unit cells 101 in the first row are equidistantly spaced apart (i.e., uniformly spaced apart), in one or more embodiments, the unit cells 101 in the cells first row 106 may be non-uniformly or irregularly spaced apart.

In the illustrated embodiment, each unit cell 101 in the first row 106 includes four struts 102 oriented or arranged in a square base pyramid shape. In one or more alternate embodiments, the unit cells 101 in the first row 106 may include any other suitable number of struts 102 and the struts 102 may be arranged into any other suitable configuration, such as, for instance, three struts arranged in a tetrahedron shape (i.e., a triangular base pyramid shape) or five struts arranged in a pentagonal base pyramid shape. Although in the illustrated embodiment each of the unit cells 101 in the first row 106 have the same number of struts 102 that are arranged in the same configuration, in one or more embodiments, the number of struts 102 in each unit cell 101 may vary across the first row 106. Additionally, as illustrated in FIG. 1B, the struts 102 in each unit cell 101 in the first row 106 may be oriented at any suitable inclination angle θ relative an imaginary horizontal plane, such as, for instance, from approximately (about) 20 degrees to approximately (about) 70 degrees. In the illustrated embodiment, the struts 102 of each unit cell 101 in the first row 106 are oriented at an inclination angle θ of approximately (about) 60 degrees.

Still referring to the embodiment illustrated in FIGS. 1A and 1B, a second row 108 of the sparse micro-truss structure 100 includes a plurality of unit cells 101 that are aligned with the unit cells 101 in the first row 106. Accordingly, adjacent unit cells 101 in the second row 108 are spaced apart by a gap 109 having the same distance $D_1$ as adjacent unit cells 101 in the first row 106. Furthermore, in the illustrated embodiment, the unit cells 101 in the second row 108 are spaced apart from corresponding unit cells 101 in the first row 106 by a gap 110 having a distance $D_2$. In the illustrated embodiment, the distance $D_2$ between the unit cells 101 in the second row 108 and the corresponding unit cells 101 in the first row 106 is equal or substantially equal to a length L of the corresponding unit cells 101 in the first row 106 defined between lower ends 105 of the struts 102. In one or more alternate embodiments, the unit cells 101 in the in the second row 108 maybe spaced apart from the corresponding unit cells 101 in the first row 106 by any other suitable distance depending on the desired performance characteristics of the sparse micro-truss structure 100 (e.g., the unit cells 101 in the second row 108 may be spaced apart from the corresponding unit cells 101 in the first row 106 by a distance $D_2$ greater or less than the length L of the corresponding unit cells 101 in the first row 106). Additionally, in the illustrated embodiment, the distance $D_2$ that the unit cells 101 in the second row 108 are spaced apart from the corresponding unit cells 101 in the first row 106 is equal or substantially equal to the distance $D_1$ that adjacent unit cells 101 in the first row 106 are spaced apart. In one or more alternate embodiments, the distance $D_1$ may be different than the distance $D_2$.

Separating the unit cells 101 within each row 106, 108 and separating the unit cells 101 between adjacent rows 106, 108 is configured to reduce the sensitivity of the sparse micro-truss structure 100 to premature failure (e.g., premature buckling or bending deformation) due to manufacturing defects in one or more of the struts 102 compared to related art micro-truss structures having a plurality of fully interconnected unit cells (i.e., related art micro-truss structures in which the struts in each unit cell are coupled to adjacent unit cells in the same row and are coupled to adjacent unit cells in adjacent rows).

Additionally, in the illustrated embodiment, each of the unit cells 101 in the second row includes 108 four struts 102 oriented or arranged into an square-based pyramid shape, although in one or more alternate embodiments, the unit cells 101 in the second row 108 may include any other suitable number of struts 102 and the struts 102 may be arranged into any other suitable configuration, such as, for instance, three struts arranged in a tetrahedron shape (i.e., a triangular based pyramid shape) or five struts arranged in a pentagonal pyramid shape. Additionally, in the illustrated embodiment, the unit cells 101 in the second row 108 have the same configuration as the unit cells 101 in the first row 106, although in one or more alternate embodiments, the unit cells 101 in the second row 108 may have a different configuration than the unit cells 101 in the first row 106. Although in the illustrated embodiment each of the unit cells 101 in the second row 108 have the same number of struts 102 that are arranged in the same configuration, in one or more embodiments, the number of struts 102 in each unit cell 101 may vary across the second row 108.

In the illustrated embodiment, the sparse micro-truss structure 100 also includes a third row 111 and a fourth row 112 of unit cells 101. The third and fourth rows 111, 112 of unit cells 101 may have the same or substantially the same configuration as the first row 106 and/or the second row 108. Accordingly, in the illustrated embodiment the sparse micro-truss structure 100 includes four rows 106, 108, 111, 112 and four columns 113, 114, 115, 116 of unit cells 101. Although in the illustrated embodiment the sparse micro-truss structure 100 includes four rows 106, 108, 111, 112 and each row includes four unit cells 101, in one or more embodiments, the sparse micro-truss structure 100 may include any other suitable number of rows and each row 106, 108, 111, 112 may include any other suitable number of unit cells 101 depending, for instance, on the desired size and performance characteristics of the sparse micro-truss structure 100. Additionally, in one or more embodiments, the number of rows 106, 108, 111, 112 may be different than the number of columns 113, 114, 115, 116.

Additionally, in the illustrated embodiment, the unit cells 101 are half unit cells. In one or more alternate embodiments, the unit cells 101 may be full unit cells. Full unit cells are half unit cells mirrored about an imaginary plane extending through the nodes 104. In an embodiment in which the unit cells 101 are full unit cells, the struts 102 may intersect and define a node at an intermediate portion along the struts 102 (e.g., each unit cell 101 may include a node located at or proximate a center of the struts 102). In one or more embodiments, the unit cells 101 may be half unit cells mirrored about an imaginary plane extending through lower ends 105 of the struts 102. For instance, in one or more embodiments, the unit cells 101 may be octahedral shaped unit cells. In another embodiment, the sparse micro-truss structure 100 may include a plurality of layers, each layer having an array of half unit cells or full unit cells, stacked on top of each other. In one embodiment, adjacent layers may be separated by a facesheet or other structural member.

Additionally, the struts 102 may be either solid or hollow. In an embodiment in which the struts 102 are hollow, the struts 102 may have any suitable wall thickness depending on the desired performance characteristics of the sparse micro-truss structure 100. The struts 102 may be made out any material suitable for the intended application of the sparse micro-truss structure 100 and the desired mechanical properties of the sparse micro-truss structure 100, such as, for instance, polymer (e.g., parylene), metal (e.g., nickel, aluminum), metal alloy (e.g., nickel-phosphorous alloy), ceramic, or any combination thereof.

With continued reference to the embodiment illustrated in FIGS. 1A and 1B, the sparse-truss structure 100 also includes an upper facesheet 117 coupled to the nodes 104 and a lower facesheet 118 coupled to the lower ends 105 of the struts 102. In FIG. 1A, the upper facesheet 118 is broken away to reveal the unit cells 101 in the first and second rows 106, 108. The upper and lower facesheets 117, 118 may be made out of any suitable material depending on the desired performance characteristics of the sparse micro-truss structure 100. The facesheets 117, 118 may be made out of the same material as the struts 102 or a material dissimilar from the material of the struts 102. The facesheets 117, 118 may be either integrally formed with the unit cells 101 or separately formed and coupled to the unit cells 101 by any suitable manufacturing process or technique, such as, for instance, bonding or adhering. Additionally, although in the illustrated embodiment the upper and lower facesheets 117, 118 are planar or substantially planar, in one or more alternate embodiments, the upper facesheet 117 and/or the lower facesheet 118 may be non-planar (e.g., the upper facesheet 117 and/or the lower facesheet 118 may be curved). In one or more embodiments, the sparse micro-truss structure 100 may be provided without the upper facesheet 117 and/or without the lower facesheet 118.

Figure 2A:
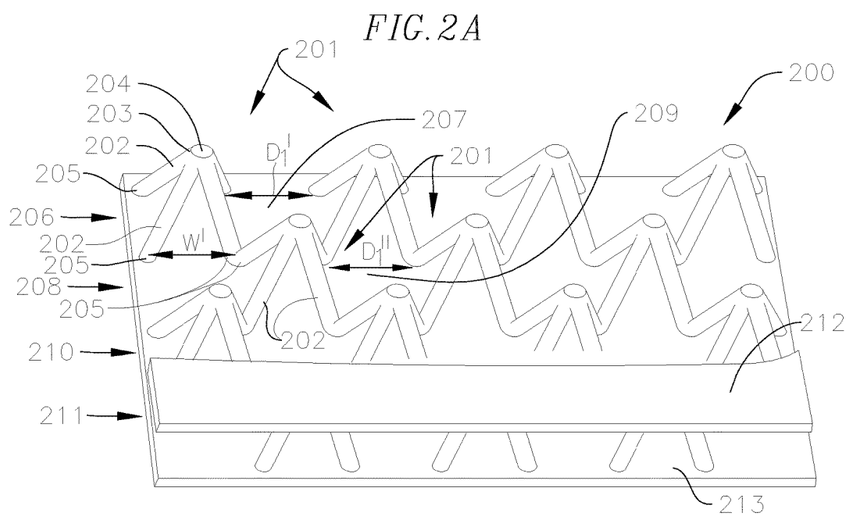
FIGS. 2A and 2B are a perspective view and a side view, respectively, of a sparse micro-truss structure according to another embodiment of the present disclosure.
Figure 2B:
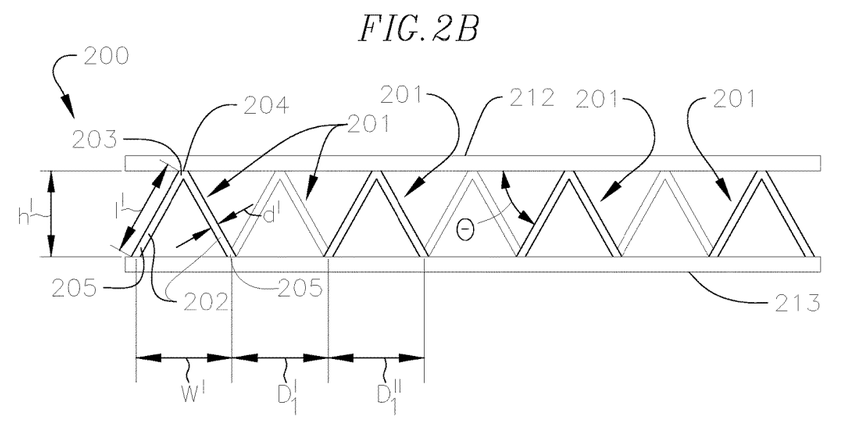

With reference now to FIGS. 2A and 2B, a sparse micro-truss structure 200 according to another embodiment of the present disclosure includes a plurality of unit cells 201 arranged in a staggered or offset array having a plurality of rows. In the illustrated embodiment, the array is rectilinear, although in one or more alternate embodiments, the array may have any other suitable configuration, such as, for instance, a circular array. Additionally, in the illustrated embodiment, each of the unit cells 201 includes a plurality of interconnected struts 202. In each unit cell 201, upper ends 203 of the struts 202 intersect and are interconnected at a node 204. In the illustrated embodiment, each of the struts 202 has a length l' measured from a lower end 205 of the strut 202 to the upper end 203 of the strut 202 at the node 204. Although in the illustrated embodiment the length l' of the struts 202 is constant across the sparse micro-truss structure 200, in one or more alternate embodiments, the length l' of the struts 202 may vary across the sparse micro-truss structure 200 (e.g., the length l' of the struts 202 may vary between the unit cells 201). Additionally, in the illustrated embodiment, each unit cell has a height h'. Although in the illustrated embodiment the height h' of the unit cells 201 is constant across the sparse micro-truss structure 200, in one or more alternate embodiments, the height h' of the unit cells 201 may vary across the sparse micro-truss structure 200 (e.g., the height h' of the unit cells 201 may vary between the unit cells 201). In the illustrated embodiment, the struts 202 have a circular cross-section having an outer diameter d'. In one or more alternate embodiments, the struts 202 may have any other cross-sectional shape suitable for the intended application of the sparse micro-truss structure 200, such as, for instance, triangular, pentagonal, hexagonal, polygonal, oval, or star-shaped. Although in the illustrated embodiment each strut 202 has the same diameter d', in one or more embodiments, the diameter d' of the struts 202 may vary across the sparse micro-truss structure 200 (e.g., the diameter d' of the struts 202 may vary between the unit cells 201). Additionally, in one or more embodiments, the diameter d' of the struts 202 may vary (e.g., taper) along the length of the strut 202. The height h' of the unit cells 201 and the length l' and diameter d' of the struts 202 may be selected based on the desired performance characteristics of the sparse micro-truss structure 200.

With continued reference to the embodiment illustrated in FIGS. 2A and 2B, each of the unit cells 201 in a first row 206 of the sparse micro-truss structure 200 is spaced apart from an adjacent one of the unit cells 201 in the first row 206 by a gap 207 having a distance $D_{1'}$. The distance $D_{1'}$ is measured between the lower ends 205 of the struts 202 of the adjacent unit cells 201 in the first row 206. Accordingly, the struts 202 of each of the unit cells 201 are disconnected from the struts 202 of the adjacent unit cells 201 in the first row 206. In the illustrated embodiment, the distance $D_{1'}$ that adjacent unit cells 201 in the first row 206 are spaced apart is equal or substantially equal to a width W' of the unit cells 201 in the first row 206 defined between the lower ends 205 of the struts 202, although in one or more alternate embodiments, the unit cells 201 in the in the first row 206 maybe spaced apart by any other suitable distance depending on the desired performance characteristics of the sparse micro-truss structure 200 (e.g., the adjacent unit cells 201 in the first row 206 may be spaced apart by a distance greater or less than the width W' of the unit cells 201 in the first row 206). Additionally, although in the illustrated embodiment the unit cells 201 in the first row 206 are equidistantly space apart (i.e., uniformly spaced apart), in one or more embodiments, the unit cells 201 of the first row 206 may be non-uniformly or irregularly spaced apart.

In the illustrated embodiment, each unit cell 201 in the first row 206 includes four struts 202 oriented or arranged into an square pyramid shape, in one or more alternate embodiments, the unit cells 201 may include any other suitable number of struts 202 and the struts 202 may be arranged into any other suitable configuration, such as, for instance, three struts arranged in a tetrahedron shape (i.e., a triangular based pyramid shape) or five struts arranged in a pentagonal base pyramid shape. Additionally, as illustrated in FIG. 2B, the struts 202 of each unit cell 201 may be oriented at any suitable inclination angle θ' relative to an imaginary horizontal plane, such as, for instance, from approximately (about) 20 degrees to approximately (about) 70 degrees. In the illustrated embodiment, the struts 202 of each unit cell 201 in the first row 206 are oriented at an inclination angle θ' of approximately (about) 60 degrees.

Still referring to the embodiment illustrated in FIGS. 2A and 2B, a second row 208 of the sparse micro-truss structure 200 includes a plurality of unit cells 201 that are laterally offset from the unit cells 201 in the first row 206. In the illustrated embodiment, the unit cells 201 in the second row 208 are aligned with the gaps 207 between the adjacent unit cells 201 in the first row 206, although in one or more alternate embodiments, the unit cells 201 in the second row 208 may be only partially aligned with the gaps 207 defined between the unit cells 201 in the first row 206 (i.e., the unit cells 201 in the second row 208 may be only partially offset from the unit cells 201 in the first row 206). Additionally, the unit cells 201 are spaced apart from adjacent unit cells 201 in the second row 208 by a gap 209 having a distance $D_{1'''}$. In the illustrated embodiment, the adjacent unit cells 201 in the second row 208 are spaced apart by the same distance $D_{1'}$ as adjacent unit cells 201 in the first row 206, although in one or more embodiments, the adjacent unit cells 201 in the second row 208 may be spaced apart by a distance $D_{1''}$ that is different than the distance $D_{1'}$ the adjacent unit cells 201 in the first row 206 are spaced apart. Additionally, although in the illustrated embodiment the unit cells 201 in the second row 208 are equidistantly space apart (i.e., uniformly spaced apart), in one or more embodiments, the unit cells 201 of the second row 208 may be non-uniformly or irregularly spaced apart.

Additionally, in the illustrated embodiment, each of the unit cells 201 in the second row 208 includes four struts 202 oriented or arranged into an square pyramid shape, although in one or more alternate embodiments, the unit cells 201 may include any other suitable number of struts 202 and the struts 202 may be arranged into any other suitable configuration, such as, for instance, three struts arranged in a tetrahedron shape (i.e., a triangular based pyramid shape) or five struts arranged in a pentagonal pyramid shape. Additionally, in the illustrated embodiment, the unit cells 201 in the second row 208 have the same configuration as the unit cells 201 in the first row 206, although in one or more alternate embodiments, the unit cells 201 in the second row 208 may have a different configuration than the unit cells 201 in the first row 206.

In the illustrated embodiment, the sparse micro-truss structure 200 also includes a third row 210 of unit cells 201 that has the same or similar configuration as the first row 206 and a fourth row 211 of unit cells 201 that has the same or similar configuration as the second row 208. Although in the illustrated embodiment, the sparse micro-truss structure 200 includes four rows 206, 208, 210, 211, in one or more embodiments, the sparse micro-truss structure 200 may include any other suitable number of rows 206, 208, 210, 211 and each row 206, 208, 210, 211 may include any suitable number of unit cells 201 depending, for instance, on the desired size and performance characteristics of the sparse micro-truss structure 200.

In the embodiment illustrated in FIG. 2A, the lower end 205 of each of the struts 202 in the second row 208 is coupled to the lower end 205 of one of the struts 202 in either the first row 206 or the third row 210. Accordingly, in the illustrated embodiment, the unit cells 201 in the first row 206 are spaced apart from adjacent unit cells 201 in the first row 206 and the unit cells 201 in the second row 208 are spaced apart from adjacent unit cells 201 in the second row 208, but the unit cells 201 in the first row 206 are coupled to the unit cells 201 in the second row 208. Accordingly, the embodiment of the sparse micro-truss structure 200 illustrated in FIGS. 2A and 2B has reduced interconnectivity compared to a related art micro-truss structure in which the unit cells are coupled both to adjacent unit cells in the same row and to adjacent unit cells in adjacent rows. Separating the unit cells 201 within each row 206, 208, 210, 211 is configured to reduce the sensitivity of the sparse micro-truss structure 200 to premature failure (e.g., premature buckling or bending deformation) due to manufacturing defects in one or more of the struts 202 compared to related art micro-truss structures having a plurality of fully interconnected unit cells. In one or more alternate embodiments, the unit cells 201 in the second row 208 may be spaced apart from the unit cells 201 in the first row 206 by any suitable distance depending, for instance, on the desired performance characteristics of the sparse micro-truss structure 200.

Additionally, in the illustrated embodiment, the unit cells 201 are half unit cells. In one or more alternate embodiments, the unit cells 201 may be full unit cells. In an embodiment in which the unit cells 201 are full unit cells, the struts 202 may intersect and define a node at an intermediate portion along the struts 202 (e.g., each unit cell 201 may include a node located at or proximate a center of the struts 202). In one or more embodiments, the unit cells 201 may be half unit cells mirrored about an imaginary plane extending through lower ends 205 of the struts 202. For instance, in one or more embodiments, the unit cells may be octahedral shaped unit cells. In another embodiment, the sparse micro-truss structure 200 may include a plurality of layers, each layer having an array of half unit cells or full unit cells, stacked on top of each other. In one embodiment, adjacent layers may be separated by a facesheet or other structural member.

Additionally, the struts 202 may be either solid or hollow. In an embodiment in which the struts 202 are hollow, the struts 202 may have any suitable wall thickness depending on the desired performance characteristics of the sparse micro-truss structure 200. The struts 202 may be made out of any material suitable for the intended application of the sparse micro-truss structure 200 and the desired mechanical properties of the sparse micro-truss structure 200, such as, for instance, polymer (e.g., parylene), metal (e.g., nickel, aluminum), metal alloy (e.g., nickel-phosphorous alloy), ceramic, or any combination thereof.

With continued reference to the embodiment illustrated in FIGS. 2A and 2B, the sparse-truss structure 200 also includes an upper facesheet 212 coupled to the nodes 204 and a lower facesheet 213 coupled to the lower ends 205 of the struts 202. In FIG. 2A, the upper facesheet 212 is broken away to reveal the unit cells 201 in the first and second rows 206, 208. The upper and lower facesheets 212, 213 may be made out of any suitable material depending on the desired performance characteristics of the sparse micro-truss structure 200. The facesheets 212, 213 may be made out of the same material as the struts 202 or a material dissimilar from the material of the struts 202. The facesheets 212, 213 may be either integrally formed with the unit cells 201 or separately formed and coupled to the unit cells 201 by any suitable manufacturing process or technique, such as, for instance, bonding or adhering. Additionally, although in the illustrated embodiment the upper and lower facesheets 212, 213 are planar or substantially planar, in one or more alternate embodiments, the upper facesheet 212 and/or the lower facesheet 213 may be non-planar (e.g., the upper facesheet 212 and/or the lower facesheet 213 may be curved). In one or more embodiments, the sparse micro-truss structure 200 may be provided without the upper facesheet 212 and/or without the lower facesheet 213.

Figure 3:
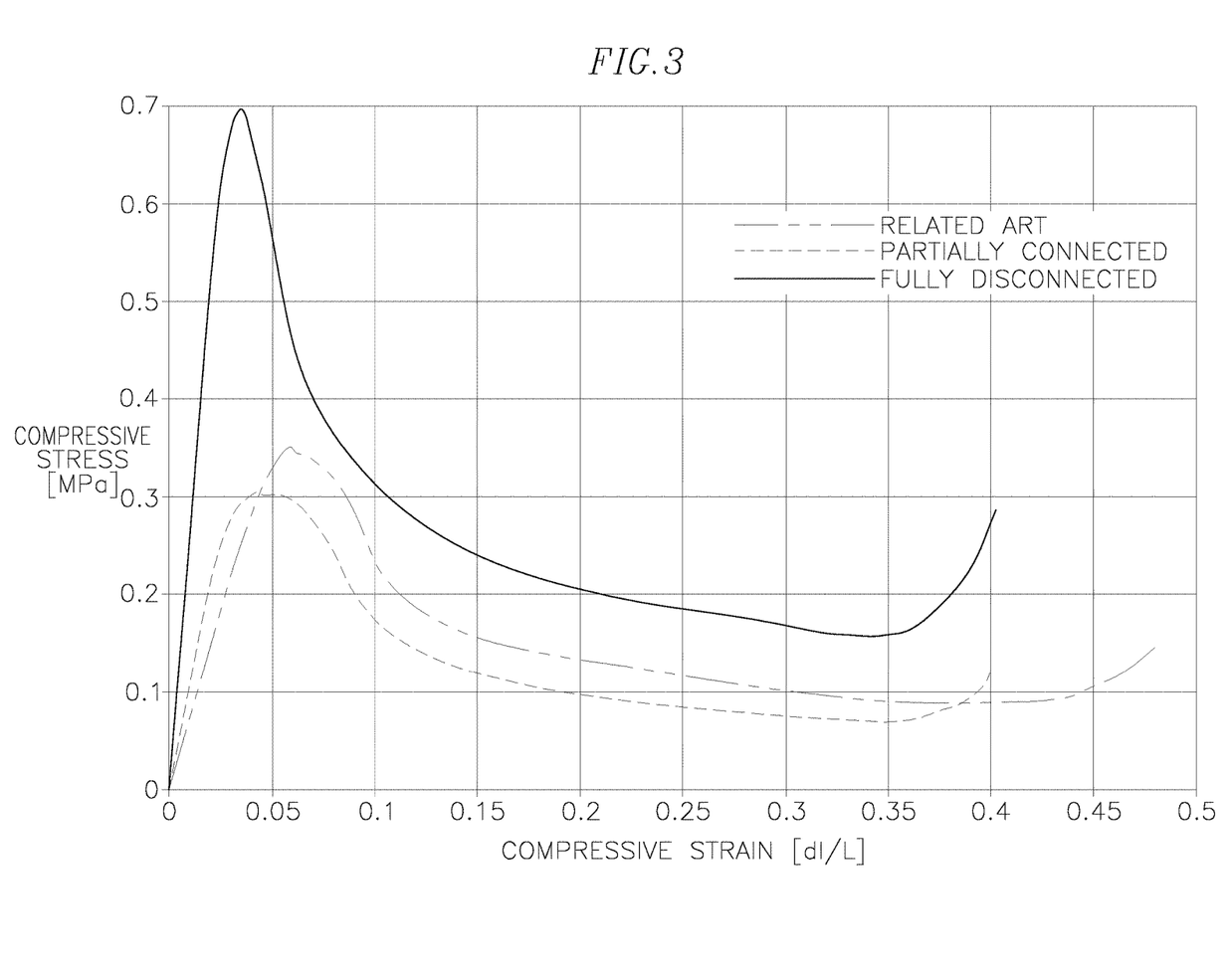
FIG. 3 is a stress-strain graph comparing the compressive strength of a related art micro-truss structure to two sparse micro-truss structures according to embodiments of the present disclosure.

The embodiments of the sparse micro-truss structures 100, 200 of the present disclosure were compression tested with a screw-driven universal testing machine. FIG. 3 is graph illustrating the stress and strain exhibited by the sparse micro-truss structures 100, 200 of the present disclosure and a related art micro-truss structure when subject to compressive loading. As illustrated in FIG. 3, the embodiment of the sparse micro-truss structure 100 illustrated in FIGS. 1A and 1B exhibited a maximum compressive stress of approximately (about) 0.7 MPa at a compressive strain ($\Delta l/L$) of approximately (about) 0.03. The embodiment of the sparse micro-truss structure 200 illustrated in FIGS. 2A and 2B exhibited a maximum compressive stress of approximately (about) 0.3 MPa at a compressive strain of approximately (about) 0.05. Further, as illustrated in FIG. 3, a related art micro-truss structure including a series of fully interconnected unit cells exhibited a maximum compressive stress of approximately (about) 0.35 MPa at a compressive strain of approximately (about) 0.06.

Accordingly, the embodiment of the sparse micro-truss structure 100 illustrated in FIGS. 1A and 1B exhibited a maximum compressive stress of approximately (or about) twice the maximum compressive stress exhibited by the related art micro-truss structure. Thus, the embodiment of the sparse micro-truss structure 100 illustrated in FIGS. 1A and 1B exhibited increased mechanical performance compared to the related art micro-truss structure over the entire range of the compressive loads applied to the micro-truss structures.

The table below summarizes the test results of the embodiments of the sparse micro-truss structure 100, 200 of the present disclosure and a related art micro-truss structure.

|  | Baseline Conventional Structure | Partially Connected Unit Cells (e.g., FIGS. 2A, 2B) | Fully Disconnected Unit Cells (e.g., FIGS. 1A, 1B) |
|---|---|---|---|
| Compressive Strength (MPa) | 0.33 | 0.30 | 0.70 |
| Compressive Modulus (MPa) | 7.45 | 10.85 | 26.33 |
| Specific Strength (MPa/(g/cc)) | 4.94 | 7.25 | 15.85 |
| Specific Compressive Modulus (MPa/(g/cc)) | 111.82 | 258.35 | 599.26 |
| Relative Density | 4.97% | 3.13% | 3.28% |

As described in more detail below, the degree of reduced interconnectivity between the unit cells compared to a related art fully interconnected micro-truss structure (i.e., the sparsity of the sparse micro-truss structure) may be selected based on the desired performance characteristics (e.g., compressive strength and shear strength) of the sparse micro-truss structure. Additionally, the size of the struts (e.g., the slenderness or aspect ratio of the struts) may be selected based on the desired performance characteristics of the sparse micro-truss structure. The size of the struts of the sparse micro-truss structure may also be selected to maintain the same mass as the related art fully interconnected micro-truss structure despite the relatively higher sparsity of the unit cells in the sparse micro-truss structure.

Depending on the size of the struts in the sparse micro-truss structure, the critical buckling stress for individual solid struts is defined by either Johnson dominated buckling or Euler dominated buckling, as follows:

$$\sigma_{Euler} = \frac{c\pi^2 E}{\left(\frac{l}{r^*}\right)^2}$$

$$\sigma_{Johnson} = \sigma_y \left(1 - \frac{\sigma_y \left(\frac{l}{r^*}\right)^2}{4c\pi^2 E}\right),$$

where E is Young's modulus of the strut material (e.g., polymer (e.g., parylene), metal (e.g., nickel, aluminum), metal alloy (e.g., nickel-phosphorous alloy), ceramic, or any combination thereof), $\sigma_y$ is the yield strength of the strut material, l is the length of the strut, c is a parameter that can vary between 0.25 and 4 and that describes the end conditions of the struts, and $r^*$ is the radius of gyration, which is defined as:

$$r^* = \sqrt{\frac{I}{A}},$$

where I is the area moment of inertia of the strut cross-section and A is the area of the strut cross-section. If the ratio of strut length l to radius of gyration $r^*$ is greater than or equal to $\pi\sqrt{2cE/\sigma_y}$ then the critical stress, $\sigma_{crit}$, is Euler-buckling stress ($\sigma_{Euler}$) and if the ratio of strut length l to radius of gyration $r^*$ is less than $\pi\sqrt{2cE/\sigma_y}$ then the critical stress, $\sigma_{crit}$, is Johnson-buckling stress ($\sigma_{Johnson}$), as shown below:

$$\sigma_{crit} = \begin{cases} \sigma_{Euler}; l/r^* \geq \pi\sqrt{2cE/\sigma_y} \\ \sigma_{Johnson}; l/r^* < \pi\sqrt{2cE/\sigma_y} \end{cases}$$

In one embodiment, the diameter of the struts may be selected such that the sparse micro-truss structure exhibits Johnson buckling (i.e., the ratio $l/r^*$ of the struts may be selected to be greater than or equal to $\pi\sqrt{2cE/\sigma_y}$ such that the sparse micro-truss structure does not exhibit Euler buckling). In one embodiment, the sparsity of the sparse micro-truss structure and the diameter of the struts may be selected such that the yield strength $\sigma_y$ exceeds the critical stress, $\sigma_{crit}$. In an embodiment in which the struts are hollow tubes, the wall thickness of the hollow tubes may be selected to prevent local buckling modes (e.g., shear wrinkling) of the hollow tubular struts.

The compressive strength, $\sigma_{compression}$, of a micro-truss structure having a plurality of pyramidal unit cells (e.g., the sparse micro-truss structures 100 or 200 described above with reference to FIGS. 1A, 1B and FIGS. 2A, 2B, respectively) is related to the critical stress, $\sigma_{crit}$, of individual struts as follows:

$$\sigma_{compression} = \rho^* \sin^2(\theta) \sigma_{crit},$$

where $\rho^*$ is the relative density (i.e., volume fraction) of the micro-truss structure and $\theta$ is the inclination angle of the struts in each unit cell (i.e., the angle defined between the struts in each unit cell and an imaginary horizontal plane).

The shear strength, $\tau$, of a micro-truss structure having a plurality of pyramidal unit cells (e.g., the sparse micro-truss structures 100 and 200 described above with reference to FIGS. 1A, 1B and FIGS. 2A, 2B, respectively) is related to the critical stress, $\sigma_{crit}$, of individual struts as follows:

$$\tau = \frac{\rho^*}{4} \frac{\sin^2(\theta)}{\cos(\psi)} \sigma_{crit},$$

where $\psi \leq 45°$ is the angle between the shear loading direction and the longitudinal direction of one of the struts in the unit cell.

The relative density, $\rho^*$, of a micro-truss structure having a plurality of pyramidal unit cells is determined as follows:

$$\rho^* = \frac{2\pi r_o^2}{L_0^2 \cos^2\theta \sin\theta}$$

where $r_o$ and $L_o$ are the radius and the length, respectively, of the individual struts of the unit cells.

Accordingly, there are three geometric parameters that can be changed or selected to increase the mechanical performance (e.g., the shear strength r and the compressive strength $\sigma_{compression}$) of the sparse micro-truss structure: (1) the strut inclination angle $\theta$; (2) the relative density $\rho^*$ of the sparse micro-truss structure; and (3) slenderness ratio of the struts (e.g., the ratio of the length of the struts to the diameter of the struts). However, increasing the strut inclination angle $\theta$ to an angle greater than 60 degrees improves compressive strength $\sigma_{compression}$ at the expense of reduced shear strength $\tau$. Additionally, increasing the relative density $\rho^*$ of the micro-truss structure comes at the expense of increasing the overall mass of the structure. In low relative density structures, the primary failure mode is generally strut buckling, and therefore reducing the slenderness ratio $\rho^*$ of the struts may improve both the shear strength and the compressive strength of the micro-truss structure.

In one embodiment, the sparse micro-truss structures 100, 200 of the present disclosure may have improved mechanical performance (e.g., improved shear strength r and compressive strength $\sigma_{compression}$) without an increase in mass compared to an otherwise comparable related art micro-truss structure having a plurality of fully interconnected unit cells (i.e., the sparse micro-truss structures may have the same or substantially the same mass as an otherwise comparable related art micro-truss structure having a plurality of fully interconnected unit cells but with improved mechanical performance). As described above, the mechanical performance of the sparse micro-truss structure may be increased by reducing the slenderness ratio of the struts (e.g., increasing the radius of the struts). The constant mass may be maintained by increasing the radius of the struts with the mass saved by reducing the number of unit cells (i.e., reducing the slenderness ratio of the struts by redistributing the mass saved from increasing the sparsity of the micro-truss structure). Accordingly, the sparse micro-truss structures of the present disclosure may have improved mechanical performance compared to related art fully populated micro-truss structures due to the reduced slenderness ratio of the struts while maintaining the same overall mass as a related art fully populated micro-truss structure by increasing the sparsity of the micro-truss structure. For hollow tubular struts, the constant mass may be maintained by increasing the wall thickness of the hollow tubular struts. The increase in radius $r_o$ and length $L_o$, respectively, of the struts necessary to maintain the same mass as the related art micro-truss structure is expressed as follows:

$$r = \sqrt{n} r_o$$

$L = \sqrt{n} L_o,$ where n is the sparsity of the sparse micro-truss structure, which is defined as the ratio of the number of unit cells in a related art fully interconnected micro-truss structure to the number of unit cells in the sparse micro-truss structure. For instance, the embodiment of the sparse micro-truss structure 100 illustrated in FIGS. A and 1B has a sparsity n of 49/16≈3 and the embodiment of the sparse micro-truss structure 200 illustrated in FIGS. 2A and 2B has a sparsity n of 28/14=2 (e.g., a related art fully populated and interconnected micro-truss structure with the same overall dimensions as the sparse micro-truss structure in FIGS. 1A and 1B would have 49 unit cells (i.e., 7 rows and 7 columns) and a related art fully populated and interconnected micro-truss structure with the same overall dimensions as the sparse micro-truss structure in FIGS. 2A and 2B would have 28 unit cells (i.e., 4 rows and 7 columns), but the sparse micro-truss structure 100 in FIGS. 1A and 1B has only 16 unit cells and the sparse micro-truss structure 200 in FIGS. 2A and 2B has only 14 unit cells).

Relative density is then calculated as:

$$\rho^* = \frac{2\pi r^2}{L^2 \cos^2\theta \sin\theta} = \frac{2\pi(\sqrt{n}\, r_0)^2}{(\sqrt{n}\, L_0)^2 \cos^2\theta \sin\theta} = \frac{2\pi r_o^2}{L_0^2 \cos^2\theta \sin\theta}$$

Thus, the relative density ρ* is kept constant for any degree of sparsity n.

Figure 4:
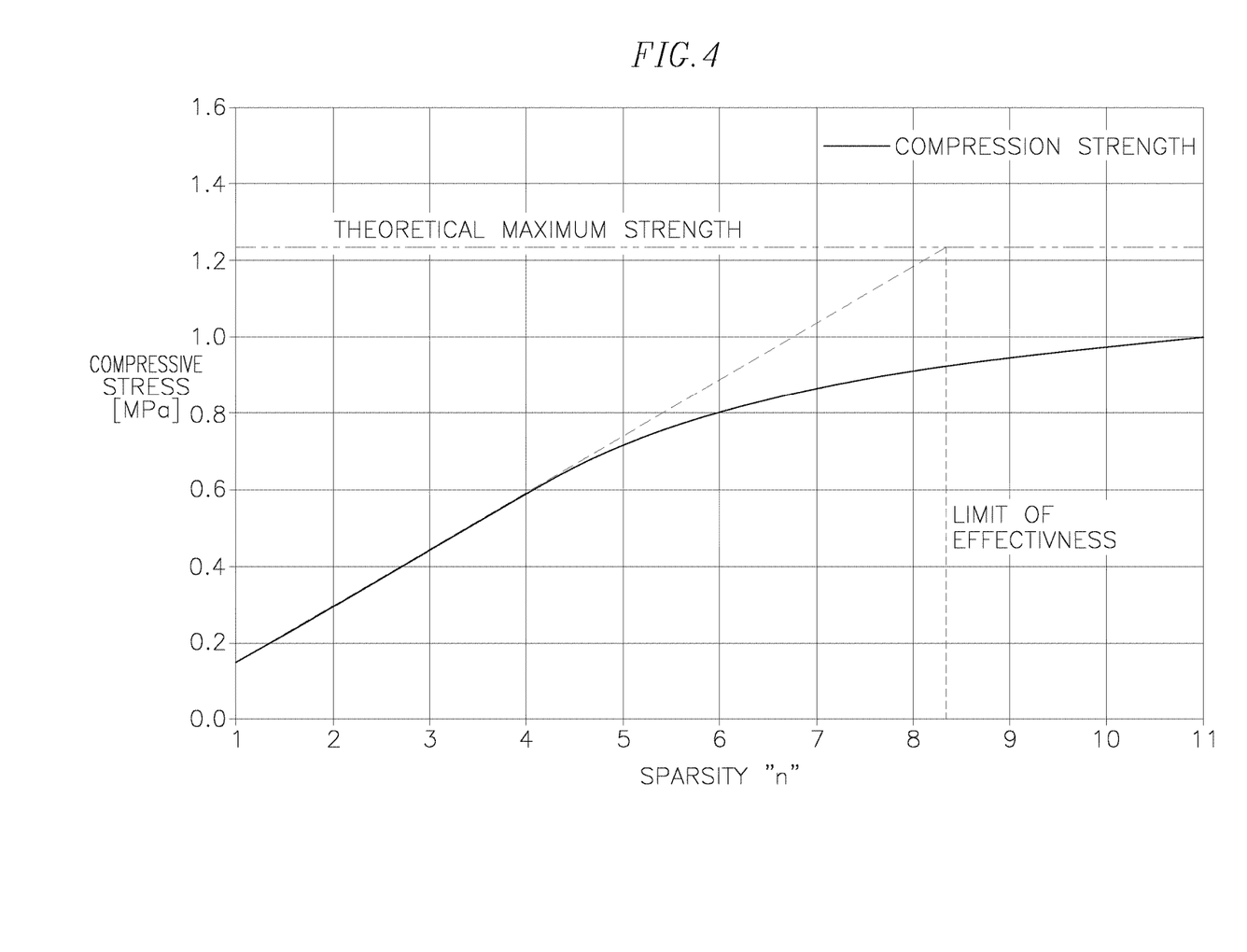
FIG. 4 illustrates the compression strength of a sparse micro-truss structure according to one embodiment of the present disclosure as a function of unit cell sparsity.

FIG. 4 illustrates the compressive strength of a sparse micro-truss structure according to one embodiment of the present disclosure as a function of sparsity n where the sparse micro-truss structure has struts with a radius $r_o$ of 0.45 mm, an inclination angle θ of 60°, a virtual strut length L of 14.665 mm, a yield strength $\sigma_y$ of 60 MPA, a Young's Modulus E of 3.1 GPa, a strut end condition c of 1, and a relative density ρ* of 2.73%.

Figure 5A:
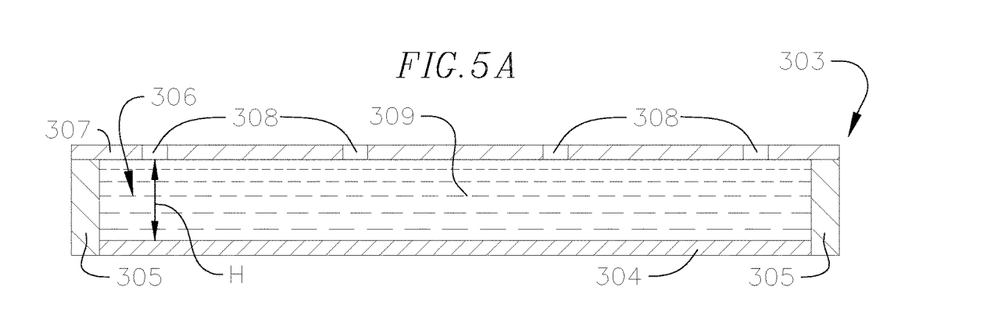
FIGS. 5A-5C illustrate tasks of forming a sparse micro-truss structure according to one embodiment of the present disclosure.
Figure 5B:
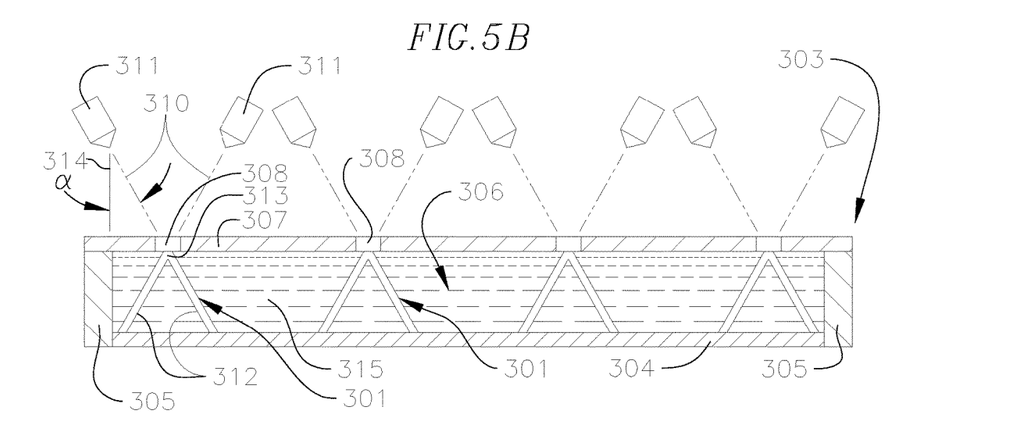
Figure 5C:
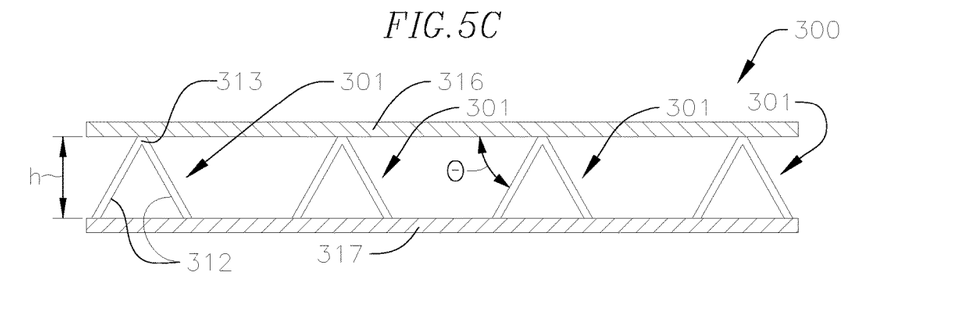

FIGS. 5A-5C illustrate a method of manufacturing a sparse micro-truss structure 300 having a plurality of unit cells 301 arranged in an array according to one embodiment of the present disclosure. As illustrated in FIG. 5A, the method includes a task of obtaining or providing a mold 303 having a base 304 and vertical wall or rim 305 extending upward from a periphery of the base 304. Together, the base 304 and the rim 305 of the mold 303 define a chamber or reservoir 306. With continued reference to the embodiment illustrated in FIG. 5A, the method also includes a task of covering an upper end of the mold 303 (e.g., an upper end of the reservoir 306) with a mask 307. The mask 307 defines a plurality of apertures 308. The mask 307 may define any desired number of apertures 308 and the apertures 308 may have any desired size, shape, and spacing, depending upon the desired characteristics of the micro-truss structure, as described below in more detail. The mask 307 may be made of any suitable material, such as, for instance, biaxially-oriented polyethylene terephthalate.

With continued reference to the embodiment illustrated in FIG. 5B, the method includes a task of filling the reservoir 306 with a volume of liquid photo-monomer 309. The liquid photo-monomer 309 may be filled to any suitable height H in the reservoir 306 depending on the desired height h of the unit cells 301 of the sparse micro-truss structure 300 (see FIG. 5C). The photo-monomer 309 is configured to polymerize when exposed to light within a particular range of wavelengths, such as, for instance, ultraviolet light (i.e., wavelengths between 250 nm and 400 nm). The liquid photo-monomer 309 may be any suitable type or kind of monomer configured to polymerize when exposed to light, such as, for instance, thiols, acrylates, methacrylates, or cationic polymers (e.g., photo-cured epoxies). Suitable liquid photo-monomers are described in U.S. Pat. No. 8,017,193, the entire content of which is incorporated herein by reference.

Referring now to the embodiment illustrated in FIG. 5B, the method also includes a task of irradiating the volume of liquid photo-monomer 309 in the reservoir 306 with a plurality of light beams 310 (e.g., collimated or substantially collimated ultraviolet light ("UV") beams) from one or more light sources 311. The task of irradiating the photo-monomer 309 includes directing the collimated light beams 310 from the one or more light sources 311 down through the apertures 308 in the mask 307 and into the volume of liquid photo-monomer 309 in the reservoir 306. The light sources 311 may be any suitable types or kinds of lamps capable of emitting light beams within a range of wavelengths configured to polymerize the liquid photo-monomer 309, such as, for instance, mercury arc lamps or light-emitting diodes (LEDs). In one embodiment, the task of irradiating the photo-monomer 309 may also include directing the collimated light beams 310 from the one or more light sources 311 off of one or more mirrors and down through the apertures 308 in the mask 307 and into the liquid photo-monomer 309. Regions of the liquid photo-monomer 309 that are exposed to the collimated light beams 310 cure (i.e., polymerize). The polymerized regions propagate down through the volume of photo-monomer 309 and form a plurality of polymer optical waveguides 312. The polymer optical waveguides 312 define the struts of the unit cells 301 of the sparse micro-truss structure 300. In the illustrated embodiment, the struts 312 of each unit cell 301 intersect and are polymerized at a node 313. Suitable methods for forming polymer optical waveguides are described in U.S. Pat. Nos. 7,653,279 and 7,382,959, the entire contents of both of which are incorporated herein by reference.

The orientation of the polymer optical waveguides 312 of the sparse micro-truss structure 300 depends on the direction in which the polymer optical waveguides 312 propagate through the volume of liquid photo-monomer 309 in the reservoir 306. In one embodiment, the direction in which the polymer optical waveguides 312 propagate through the volume of photo-monomer 309 is a function of an incident angle α of the one or more light sources 311 and the light beams 310 produced therefrom relative to an imaginary axis 314 perpendicular to the mask 307 (i.e., the orientation of the polymer optical waveguides 312 is a function of the angles α at which the one or more light beams 310 penetrate the volume of photo-monomer 309 in the reservoir 306). In one or more alternate embodiments, the direction in which the polymer optical waveguides 312 propagate through the volume of photo-monomer 309 is a function of the orientation of one or more mirrors and the orientation of the one or more light sources 311 relative to the one or more mirrors. Accordingly, the method includes a task of positioning the one or more light sources 311 and/or the one or more mirrors to achieve the desired orientation of the polymer optical waveguides 312. In one embodiment, the angle α of the light beams 310 corresponds to the desired inclination angle θ between the struts 312 of the unit cells 301. The method may also include orienting the light beams 310 depending on the desired configuration of the unit cells 301. Although in the illustrated embodiment the light beams 310 are oriented to form half unit cells, in one or more alternate embodiments the light beams 310 may be oriented to form full unit cells (i.e., half unit cells mirrored about an imaginary plane extending through the nodes 313).

The cross-sectional shape and size of the polymer optical waveguides 312 is a function of the shape and size of the collimated light beams 310 directed through the volume of photo-monomer 309. The cross-sectional shape and size of the collimated light beams 310 directed through the photo-monomer 309 are dependent upon the shape and size of the apertures 308 in the mask 307. The apertures 308 in the mask 307 may have any desired shape, such as, for instance, circular, triangular, pentagonal, hexagonal, polygonal, oval, or star-shaped. Accordingly, the method may also include a task of selecting a mask having apertures with a shape and size corresponding to the desired cross-sectional shape and size of the polymer optical waveguides 312 (i.e., the struts) of the sparse micro-truss structure 300.

The configuration of the unit cells 301 also depends on the number of light beams 310 directed through each aperture 308 in the mask 307. Accordingly, the method includes a task of directing a number of light beams 310 through each aperture 308 in the mask 307 depending on the desired configuration of the unit cells 301. For instance, in one embodiment, three light beams 310 may be directed through each aperture 308 to form unit cells 301 having a triangular base pyramid shape. In another embodiment, four light beams 310 may be directed through each aperture 308 to form unit cells 301 having a square base pyramid shape.

Figure 6:
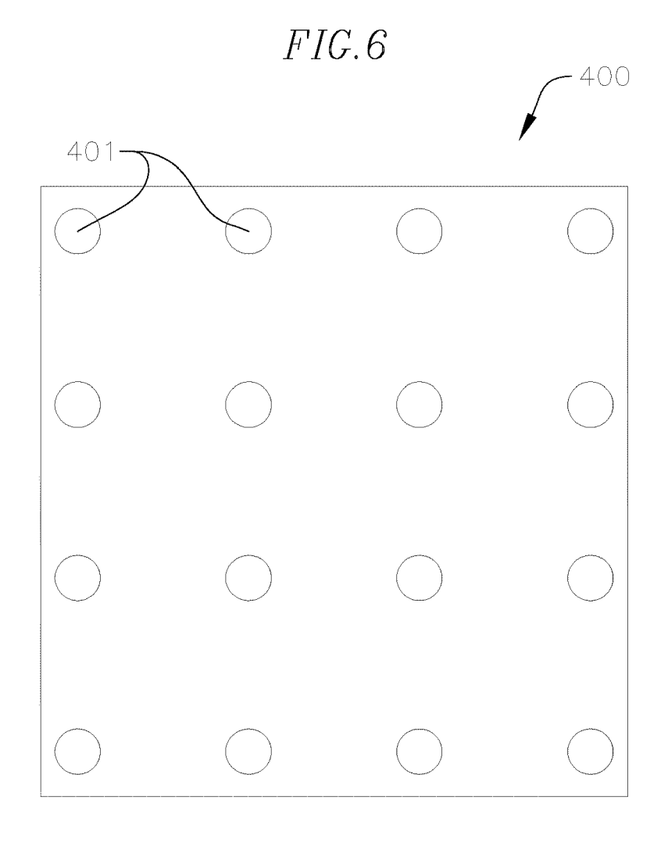
FIG. 6 illustrates a mask used during a method of forming a sparse micro-truss structure according to one embodiment of the present disclosure.
Figure 7:
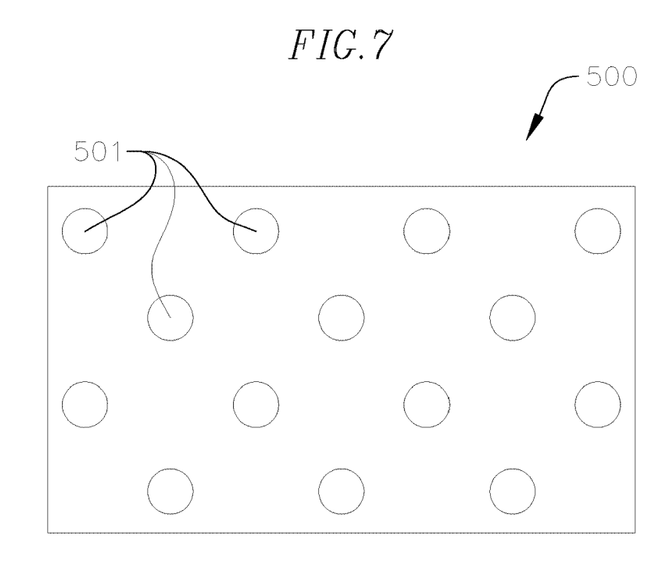
FIG. 7 illustrates a mask used during a method of forming a sparse micro-truss structure according to another embodiment of the present disclosure.

The method also includes a task of selecting a mask 307 having an arrangement of apertures 308 suitable for the desired arrangement and connectivity of the unit cells 301 of the sparse micro-truss structure 300. For instance, in one embodiment, the method may include a task of selecting the mask 400 illustrated in FIG. 6, which includes a plurality of aligned apertures 401. In one embodiment, the mask 400 with the aligned apertures 401 in FIG. 6 may be used to produce a sparse micro-truss structure having a series of aligned unit cells that are completely disconnected from adjacent unit cells, as illustrated, for instance, in the embodiment of the sparse micro-truss structure 100 of FIGS. 1A and 1B (i.e., the mask 400 in FIG. 6 may be used to form a sparse micro-truss structure having unit cells that are separated from adjacent unit cells in the same row and that are separated from the unit cells in adjacent rows). In another embodiment, the method may include a task of selecting the mask 500 illustrated in FIG. 7, which includes a plurality of staggered or laterally offset apertures 501. In one embodiment, the mask 500 with the offset apertures 501 may be used to produce a sparse micro-truss structure having a series of staggered or laterally offset unit cells that are partially connected, as illustrated, for instance, in the embodiment of the sparse micro-truss structure of FIGS. 2A and 2B (i.e., the mask 500 in FIG. 6 may be used to form a sparse micro-truss structure having a series of unit cells that are separated from adjacent unit cells in the same row but that are coupled to unit cells in an adjacent row). The method may also include a task of selecting the mask 307 such that the unit cells 301 are arranged in the desired arrangement. For instance, the method may include a task of selecting the mask 307 such that the unit cells 301 of the sparse micro-truss structure 300 are arranged in a rectilinear array or a circular array. In one embodiment, the method may include selectively blocking out or obstructing some of the apertures in a mask used to form a fully populated and interconnected micro-truss structure.

With reference now to the embodiment illustrated in FIG. 5C, the method also includes a task of removing the sparse micro-truss structure 300 from the reservoir 306 in the mold 303 and a volume of unpolymerized liquid photo-monomer 315 remaining in the reservoir 306. The method may also include a task of fully curing the polymer optical waveguides 312 (i.e., the struts) of the sparse micro-truss structure 300 after the sparse micro-truss structure 300 has been removed from the reservoir 306. In one embodiment, the task of fully curing the polymer optical waveguides 312 includes irradiating the polymer optical waveguides 312 with light (e.g., UV light) to fully cross-link the polymer optical waveguides 312.

With continued reference to the embodiment illustrated in FIG. 5C, the method also includes a task of coupling an upper facesheet 316 and a lower facesheet 317 to the sparse micro-truss structure 300. The facesheets 316, 317 may be made out of any suitable material, such as, for instance, metal (e.g., aluminum). In one embodiment, the task of coupling the facesheets 316, 317 to the sparse micro-truss structure 300 includes bonding the facesheets 316, 317 to the struts (e.g., the polymer optical waveguides) 312 of the sparse micro-truss structure 300 with a suitable adhesive, such as, for instance, an epoxy adhesive. In one or more alternate embodiments, the struts 312 may be grown directly on one or more of the facesheets 316, 317 such that the facesheets 316, 317 may be coupled to the sparse micro-truss structure 300 without a separate adhesive. For instance, in one embodiment, the upper facesheet 316 may be placed on the upper end of the mold 303 before the task of irradiating the liquid photo-monomer 309 with a plurality of light beams 310. In an embodiment in which the upper facesheet 316 is placed on the upper end of the mold 303 (e.g., on the upper end of the liquid photo-monomer 309 in the reservoir 306), the upper facesheet 316 may include a plurality of apertures aligned with the apertures 308 in the mask 307 to allow the light beams 310 to pass through the upper facesheet 316 during the task of irradiating the liquid photo-monomer 309. In another embodiment, the upper facesheet 317 placed on the upper end of the mold 303 may be made of a translucent material configured to allow the light beams 310 to pass through the upper facesheet 316 during the task of irradiating the liquid photo-monomer 309. In one embodiment, the method may include submerging the lower facesheet 317 in the volume of liquid photo-monomer 309 in the reservoir 306 before the task of irradiating the liquid photo-monomer 309 with a plurality of light beams 310 (e.g., placing the lower facesheet 317 on the base 304 before filling the reservoir 306 with the liquid photo-monomer 309).

In one or more embodiments, the method may include a task of forming a sparse micro-truss structure having a plurality of layers stacked on top of each other. Suitable methods for manufacturing a structure having a plurality of stacked micro-truss structures are described in U.S. patent application Ser. No. 14/461,841 entitled "Stacked Microlattice Materials and Fabrication Processes," filed on Aug. 18, 2014, the entire content of which is incorporated herein by reference.

Although the struts 312 of the sparse micro-truss structure 300 formed according to the method described above are polymer optical waveguides, in one or more alternate embodiments, the method may include one or more tasks for forming the struts 312 of the sparse micro-truss structure 300 out of any other suitable material, such as, for instance, polymer (e.g., parylene), metal (e.g., nickel, aluminum), metal alloy (e.g., nickel-phosphorous alloy), ceramic, or any combination thereof. In one or more embodiments, the method may include a task of using the polymer optical waveguides as a template onto which one or more dissimilar materials may be deposited onto or formed around. The dissimilar materials may be deposited onto or formed around the polymer optical waveguides by any suitable process, such as, for instance, electrodeposition, electroplating, vapor deposition (e.g., chemical vapor deposition (CVD)), spray coating, dip coating, or any combination thereof. In one embodiment, the method may also include a task of selectively removing the polymer optical waveguides by any suitable process, such as, for instance, by chemically etching the polymer optical waveguides. Selectively removing the polymer optical waveguides leaves a plurality of interconnected hollow tubular struts formed out of the material previously deposited onto the polymer optical waveguides.

Additionally, the method may include one or more tasks for spatially tailoring the mechanical properties of the sparse micro-truss structure 300 (e.g., the method may include one or more tasks for forming a non-uniform sparse micro-truss structure 300). The strength and stiffness of the sparse micro-truss structure 300 is a function of several factors, including the number of polymer optical waveguides 312 in each unit cell 301, the orientation of the polymer optical waveguides 312 in each cell 301, the cross-sectional shape and size of the polymer optical waveguides 312, the length of the polymer optical waveguides 312, the spacing between the nodes 313 of the unit cells 301, and the connectivity of the unit cells 301. Accordingly, in one or more embodiments, the method may include one or more tasks for varying the number, orientation, shape, size, length, and/or spacing of the polymer optical waveguides 312 across the sparse micro-truss structure 300. For instance, in one or more embodiments, the method may include a task of selecting a mask having a plurality of apertures that vary in shape and/or size across the mask. Accordingly, when the collimated light beams 310 are directed through the apertures 308 in the mask 307 and into the volume of the photo-monomer 309 to form the polymer optical waveguides 312, the shape and/or size of the polymer optical waveguides 312 will vary across the sparse micro-truss structure 300 (e.g., the shape and/or size of the polymer optical waveguides 312 may vary between the unit cells 301). Additionally, in one or more embodiments, the method may include a task of selecting a mask wherein the spacing between the apertures varies across the mask. Accordingly, when the collimated light beams 310 are directed through the apertures 308 in the mask 307 and into the volume of the photo-monomer 309 to form the polymer optical waveguides 312, the spacing between the unit cells 301 will vary across the micro-truss structure 300 (e.g., the spacing between the nodes 313 of the unit cells 301 varies across the sparse micro-truss structure 300). Additionally, in one or more embodiments, the method may include repositioning the light sources 311 (i.e., varying the incident angles α of the light beams 310) and/or repositioning the one or more mirrors depending on the position along the mask 307 through which the light beams 310 are directed such that the inclination angle θ between the struts 312 varies between the unit cells 301 of the sparse micro-truss structure 300.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

Although relative terms such as "outer," "inner," "upper," "lower," "below," "above," "vertical," "horizontal," and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "about," and similar terms are used as terms of approximation and not as terms of degree, and are intended to account for the to deviations in measured or calculated values that would be recognized by those of ordinary skill in the art. Moreover, the tasks described above may be performed in the order described or in any other suitable sequence. Additionally, the methods described above are not limited to the tasks described. Instead, for each embodiment, one or more of the tasks described above may be absent and/or additional tasks may be performed. Furthermore, as used herein, when a component is referred to as being "on" another component, it can be directly on the other component or components may also be present therebetween. Moreover, when a component is component is referred to as being "coupled" to another component, it can be directly attached to the other component or intervening components may be present therebetween.

What is claimed is:

1. A micro-truss structure, comprising:
    a plurality of unit cells arranged in an array, wherein:
        each of the plurality of unit cells comprises a plurality of struts interconnected at a node, and
        adjacent ones of at least two of the plurality of unit cells are spaced apart by a gap and disconnected from each other.

2. The micro-truss structure of claim 1, wherein the array is rectilinear.

3. The micro-truss structure of claim 1, wherein the plurality of unit cells comprises:
    a first plurality of unit cells arranged in a first row of the array; and
    a second plurality of unit cells arranged in a second row of the array.

4. The micro-truss structure of claim 3, wherein the array is a staggered array, and wherein the second plurality of unit cells in the second row of the array is laterally offset from the first plurality of unit cells in the first row of the array.

5. The micro-truss structure of claim 4, wherein at least one of the struts in each of the first plurality of unit cells in the first row is interconnected to one of the struts in one of the second plurality of unit cells in the second row.

6. The micro-truss structure of claim 3, wherein the second plurality of unit cells in the second row of the array is aligned with the first plurality of unit cells in the first row of the array, and wherein each of the second plurality of unit cells is spaced apart by a gap from a corresponding one of the first plurality of unit cells.

7. The micro-truss structure of claim 1, wherein each of the plurality of struts is a polymer optical waveguide.

8. The micro-truss structure of claim 1, wherein a plurality of the struts is hollow.

9. The micro-truss structure of claim 1, wherein the plurality of struts in each of the unit cells is arranged in a square base pyramid configuration or a triangular base pyramid configuration.

10. The micro-truss structure of claim 1, further comprising:
    a first facesheet coupled to the node of each of the plurality of unit cells; and a second facesheet coupled to ends of the plurality of struts.

11. The micro-truss structure of claim 1, wherein each of the plurality of unit cells is a full unit cell.

12. The micro-truss structure of claim 1, wherein each of the plurality of the unit cells is a half unit cell.

13. The micro-truss structure of claim 1, wherein each of the plurality of struts comprises a material selected from the group of materials consisting of polymer, metal, metal alloy, ceramic, and any combination thereof.

14. The micro-truss structure of claim 1, wherein at least one of a length of the struts, a diameter of the struts, a spacing between the nodes, and a height of the unit cells varies across the micro-truss structure.

15. A method of manufacturing a micro-truss structure, the method comprising:
irradiating a volume of photo-monomer with a plurality of light beams to form a plurality of unit cells arranged in an array, wherein each of the plurality of unit cells comprises a plurality of polymer optical waveguides interconnected at a node, and wherein adjacent ones of at least two of the plurality of unit cells are spaced apart by a gap and disconnected from each other.

16. The method of claim 15, wherein the plurality of light beams are directed through a plurality of apertures defined in a mask, and wherein the plurality of apertures in the mask are arranged in either an aligned array or a staggered array.

17. The method of claim 15, further comprising:
coupling a first facesheet to the node of each of the plurality of unit cells; and
coupling a second facesheet to ends of the plurality of polymer optical waveguides.

18. The method of claim 15, further comprising coating the polymer optical waveguides with a dissimilar material by a process selected from the group of processes consisting of electrodeposition, electroplating, vapor deposition, spray coating, dip coating, and combinations thereof.

19. The method of claim 18, selectively removing the polymer optical waveguides to form a plurality of interconnected hollow tubular struts formed out of the dissimilar material coated onto the polymer optical waveguides.

20. The method of claim 15, further comprising orienting the plurality of light beams such that the polymer optical waveguides in each of the unit cells are arranged in a square base pyramid configuration or a triangular base pyramid configuration.

* * * * *